(12) United States Patent
Grip et al.

(10) Patent No.: US 7,743,763 B2
(45) Date of Patent: Jun. 29, 2010

(54) STRUCTURALLY ISOLATED THERMAL INTERFACE

(75) Inventors: Robert E. Grip, Rancho Palos Verdes, CA (US); Blaine K. Rawdon, San Pedro, CA (US); Gurpreet S. Jalewalia, Fountain Valley, CA (US)

(73) Assignee: The Boeing Company, Chicago, IL (US)

( * ) Notice: Subject to any disclaimer, the term of this patent is extended or adjusted under 35 U.S.C. 154(b) by 14 days.

(21) Appl. No.: 11/829,456

(22) Filed: Jul. 27, 2007

(65) Prior Publication Data
US 2009/0025712 A1 Jan. 29, 2009

(51) Int. Cl.
*F24J 2/00* (2006.01)
(52) U.S. Cl. ........... 126/569; 136/246; 165/146; 165/185; 165/276; 165/277
(58) Field of Classification Search ............ 165/185, 165/146, 276, 277; 136/246; 126/569
See application file for complete search history.

(56) References Cited

U.S. PATENT DOCUMENTS

| | | | | |
|---|---|---|---|---|
| 2,106,060 A | * | 1/1938 | Ostrander | 174/108 |
| 2,256,027 A | * | 9/1941 | Jardine et al. | 174/15.7 |
| 2,387,829 A | * | 10/1945 | Burnham et al. | 338/214 |
| 3,361,195 A | * | 1/1968 | Motto, Jr. et al | 165/80.4 |
| 3,563,716 A | * | 2/1971 | Ching | 65/409 |
| 3,624,276 A | * | 11/1971 | Rawlins et al. | 174/129 R |
| 3,680,189 A | * | 8/1972 | Noren | 29/890.032 |
| 3,763,306 A | * | 10/1973 | Marshall | 174/115 |
| 3,774,078 A | * | 11/1973 | Martin | 361/702 |
| 4,252,263 A | * | 2/1981 | Houston | 228/193 |
| 4,361,717 A | * | 11/1982 | Gilmore et al. | 136/246 |
| 4,523,804 A | * | 6/1985 | Thompson | 385/107 |
| 4,622,054 A | * | 11/1986 | Huey et al. | 65/437 |
| 4,636,234 A | * | 1/1987 | Huey et al. | 65/437 |
| 4,654,477 A | * | 3/1987 | Isoda | 174/128.1 |
| 4,777,324 A | * | 10/1988 | Lee | 174/34 |
| 4,830,628 A | * | 5/1989 | Dyson et al. | 439/584 |

(Continued)

FOREIGN PATENT DOCUMENTS

EP 1 205 982 5/2002

(Continued)

OTHER PUBLICATIONS

Vel-Therm TM, Compliant Thermal Interface Materials, Energy Science Laboratories, Inc., San Diego, CA (May 2007).

(Continued)

*Primary Examiner*—Kenneth B Rinehart
*Assistant Examiner*—Jorge Pereiro
(74) *Attorney, Agent, or Firm*—Klintworth & Rozenblat IP LLC

(57) ABSTRACT

In one embodiment, an assembly having bodies of different thermal expansion rates comprises a first body, a second body having a different thermal expansion rate than the first body, and a plurality of high conductivity members attached to both the first and second bodies. The high conductivity members are more flexible than the first and second bodies in order to allow for varied thermal expansion of the first and second bodies. The assembly may comprise a solar collector assembly, wherein the first body is a solar cell attached to a substrate, and the second body is a heat sink.

62 Claims, 9 Drawing Sheets

U.S. PATENT DOCUMENTS

| | | | | |
|---|---|---|---|---|
| 5,077,637 | A * | 12/1991 | Martorana et al. | 361/717 |
| 5,081,981 | A * | 1/1992 | Beal | 126/92 R |
| 5,098,364 | A * | 3/1992 | Schilling | 493/200 |
| 5,110,005 | A * | 5/1992 | Schilling | 220/495.08 |
| 5,111,359 | A * | 5/1992 | Montesano | 361/709 |
| 5,216,809 | A * | 6/1993 | Abbott et al. | 29/890.08 |
| 5,224,030 | A * | 6/1993 | Banks et al. | 361/717 |
| 5,287,248 | A * | 2/1994 | Montesano | 361/708 |
| 5,316,080 | A * | 5/1994 | Banks et al. | 165/185 |
| 5,317,879 | A * | 6/1994 | Goldberg et al. | 62/51.1 |
| 5,320,520 | A * | 6/1994 | Barth et al. | 431/125 |
| 5,390,734 | A * | 2/1995 | Voorhes et al. | 165/185 |
| 5,542,471 | A * | 8/1996 | Dickinson | 165/170 |
| 5,588,300 | A * | 12/1996 | Larsson et al. | 62/3.61 |
| 5,650,914 | A * | 7/1997 | DiStefano et al. | 361/704 |
| 5,660,917 | A * | 8/1997 | Fujimori et al. | 428/195.1 |
| 5,695,847 | A * | 12/1997 | Browne | 428/112 |
| 5,741,208 | A * | 4/1998 | Moak | 493/195 |
| 5,769,158 | A * | 6/1998 | Yao | 165/185 |
| 5,849,130 | A * | 12/1998 | Browne | 156/256 |
| 5,927,270 | A * | 7/1999 | McDonald | 126/512 |
| 6,000,934 | A * | 12/1999 | Shavers et al. | 431/354 |
| 6,014,999 | A * | 1/2000 | Browne | 156/512 |
| 6,045,356 | A * | 4/2000 | Hunter et al. | 431/354 |
| 6,052,280 | A * | 4/2000 | Dilley et al. | 361/679.54 |
| 6,060,166 | A * | 5/2000 | Hoover et al. | 428/408 |
| 6,260,614 | B1 * | 7/2001 | Guy | 165/185 |
| 6,344,270 | B1 * | 2/2002 | McCullough et al. | 428/389 |
| 6,367,509 | B1 * | 4/2002 | Bonneville et al. | 138/96 R |
| 6,371,753 | B1 * | 4/2002 | O'Donnell et al. | 431/125 |
| 6,390,808 | B1 * | 5/2002 | Cakebread | 431/125 |
| 6,407,922 | B1 * | 6/2002 | Eckblad et al. | 361/704 |
| 6,452,093 | B1 * | 9/2002 | Ishii et al. | 174/16.3 |
| 6,495,761 | B1 * | 12/2002 | Hacker | 174/113 R |
| 6,542,370 | B1 * | 4/2003 | Wang et al. | 361/704 |
| 6,575,227 | B1 * | 6/2003 | Leeson et al. | 165/44 |
| 6,591,897 | B1 * | 7/2003 | Bhatti et al. | 165/80.3 |
| 6,649,844 | B2 * | 11/2003 | Kusumoto et al. | 174/128.1 |
| 6,651,736 | B2 * | 11/2003 | Chiu et al. | 165/185 |
| 6,699,036 | B2 * | 3/2004 | Schlosser et al. | 431/354 |
| 6,730,840 | B2 * | 5/2004 | Sasaoka et al. | 136/246 |
| 6,743,974 | B2 * | 6/2004 | Wada et al. | 136/255 |
| 6,768,048 | B2 * | 7/2004 | Woll et al. | 136/251 |
| 6,844,054 | B2 * | 1/2005 | Whatley | 428/295.4 |
| 6,867,976 | B2 * | 3/2005 | Belady et al. | 361/704 |
| 6,916,174 | B2 * | 7/2005 | O'Donnell et al. | 431/354 |
| 6,924,335 | B2 * | 8/2005 | Fan et al. | 524/495 |
| 6,947,285 | B2 * | 9/2005 | Chen et al. | 361/708 |
| 6,959,756 | B2 * | 11/2005 | Woodard et al. | 165/86 |
| 6,991,454 | B2 * | 1/2006 | Gore et al. | 431/328 |
| 7,004,751 | B2 * | 2/2006 | Malloy et al. | 431/154 |
| 7,048,451 | B2 * | 5/2006 | Lo et al. | 385/92 |
| 7,056,455 | B2 * | 6/2006 | Matyjaszewski et al. | 264/29.2 |
| 7,155,091 | B2 * | 12/2006 | Zamel et al. | 385/33 |
| 7,263,991 | B2 * | 9/2007 | Schlosser et al. | 126/512 |
| 7,566,490 | B2 * | 7/2009 | Mitic et al. | 428/293.1 |
| 2002/0026933 | A1 * | 3/2002 | Gottlieb | 126/628 |
| 2002/0050395 | A1 * | 5/2002 | Kusumoto et al. | 174/128.2 |
| 2002/0100581 | A1 * | 8/2002 | Knowles et al. | 165/185 |
| 2002/0132198 | A1 * | 9/2002 | O'Donnell et al. | 431/125 |
| 2002/0182397 | A1 * | 12/2002 | Whatley | 428/297.4 |
| 2003/0029600 | A1 * | 2/2003 | Woodard et al. | 165/46 |
| 2003/0047208 | A1 * | 3/2003 | Glenn et al. | 136/246 |
| 2003/0117770 | A1 * | 6/2003 | Montgomery et al. | 361/687 |
| 2003/0205223 | A1 * | 11/2003 | Schlosser et al. | 126/41 R |
| 2004/0005736 | A1 * | 1/2004 | Searls et al. | 438/122 |
| 2004/0009353 | A1 * | 1/2004 | Knowles et al. | 428/411.1 |
| 2004/0060691 | A1 * | 4/2004 | Chiu et al. | 165/185 |
| 2004/0071870 | A1 * | 4/2004 | Knowles et al. | 427/200 |
| 2004/0112424 | A1 * | 6/2004 | Araki et al. | 136/256 |
| 2004/0118501 | A1 * | 6/2004 | Chiu et al. | 156/64 |
| 2005/0263134 | A1 * | 12/2005 | Braun et al. | 123/456 |
| 2006/0180137 | A1 * | 8/2006 | McDonald | 126/25 R |

FOREIGN PATENT DOCUMENTS

WO   WO2008/049006   4/2008

OTHER PUBLICATIONS

Paper for 39th AIAA Aerospace Sciences Meeting re Carbon Velvet Thermal Interface Gaskets, Reno, NV (Jan. 8-11, 2001).

Enhanced Thermal Conductance of ORU Radiant Fin Thermal Interface using Carbon Brush Materials, Energy Science Laboratories, Inc., San Diego, CA (Proceedings of Space Technology & Applications Forum (STAIF-99), Jan. 31-Feb. 4, 1999 in Albuquerque, NM).

PCM Heatsinks; High Capacity Change Heat Sinks, Energy Science Laboratories, Inc., San Diego, CA.

International Search Report and Written Opinion dated Nov. 6, 2008 for PCT application number PCT/US2008/068043.

* cited by examiner

STRUCTURALLY ISOLATED THERMAL INTERFACE

FIELD OF THE INVENTION

The present invention relates to heat conducting assemblies, such as solar collector assemblies.

BACKGROUND

Assemblies exist today having bodies, some of which are heated and some of which are cooled. In many such assemblies it is desirable to minimize or limit the temperature of the heated bodies. By linking the bodies, heat can be conducted from the heated bodies to the cooled bodies with the result that the temperature of the heated bodies is reduced. Very effective thermal linkage will tend to make the cooled bodies nearly the same temperature as the heated bodies. The higher temperature of the cooled bodies generally increases their ability to dissipate heat, increasing the amount of heating the heated element can absorb without exceeding a temperature limit. From this it is clear that very effective thermal linkage is desirable. In general, a very effective thermal linkage places the heated and cooled bodies in close proximity and makes a complete thermal connection with a high-conductivity medium. Solder is an example of such a medium. It completely fills even a small gap between bodies and conducts heat very well. Solder also firmly connects the heated body to the cooled body. While this connection is desirable in order to consolidate the assembly it can also lead to a problem in the instance when two bodies (heated and cooled) tend to expand different amounts in operation. This may occur, for instance, if one body has a different coefficient of thermal expansion than the other. In the case of differential expansion, linkage between the two bodies will tend to compress the body of greater expansion across the surface of the interface. The body of lesser expansion will be tensioned, also across the surface of the interface. In some cases, the compression or tension stresses that arise may exceed the strength of one or both of the bodies, leading to undesirable performance of the assembly. Solder may be replaced with a non-rigid, highly-conductive paste. This eliminates the mutually induced stresses as the two bodies are not rigidly joined but requires additional components to connect the bodies together into an assembly. Such components add complexity and take up space, undesirable characteristics in some applications. Solder may also be replaced with a thermal adhesive. This provides the mechanical connection between the bodies, but generally provides substantially reduced thermal conductivity when compared to solder. Reduced conductivity leads to reduced heating capacity and/or higher temperature on the heated body or the need for a larger cooling capacity in the cooled body. This is undesirable in many applications.

An assembly having bodies of different thermal expansion rates and/or method of use is needed to decrease one or more problems associated with one or more of the existing assemblies and/or methods.

SUMMARY

In one aspect of the disclosure, a heat conducting assembly is provided. The heat conducting assembly comprises a first body and a second body, and a plurality of high conductivity members attached to both the first and second bodies. The high conductivity members are more flexible than the first and second bodies in order to allow for varied thermal expansion of the first and second bodies.

In another aspect of the disclosure, a solar collector assembly is provided. The solar collector assembly comprises a solar cell, a heat sink which has a different thermal expansion rate than the solar cell, and a plurality of high conductivity members attached between the solar cell and the heat sink. The high conductivity members allow for the transfer of heat from the solar cell to the heat sink while compensating for thermal expansion differences between the solar cell and the heat sink.

In a further aspect of the disclosure, a method is disclosed of reducing at least one of stress and strain of a solar cell. In one step, a solar collector assembly is provided comprising a solar cell and a heat sink. The heat sink has a different thermal expansion rate than the solar cell. In another step, a plurality of high conductivity members are attached between the solar cell and the heat sink. In still another step, the solar cell is heated. In an addition step, heat is transferred from the solar cell through the high conductivity members to the heat sink. During the transfer of heat portions of the high conductivity members close to the heat sink move at least one of more and less than portions of the high conductivity members close to the solar cell to compensate for the thermal expansion differences between the solar cell and the heat sink.

These and other features, aspects and advantages of the disclosure will become better understood with reference to the following drawings, description and claims.

DETAILED DESCRIPTION

The following detailed description is of the best currently contemplated modes of carrying out the disclosure. The description is not to be taken in a limiting sense, but is made merely for the purpose of illustrating the general principles of the disclosure, since the scope of the disclosure is best defined by the appended claims.

Figure 2:
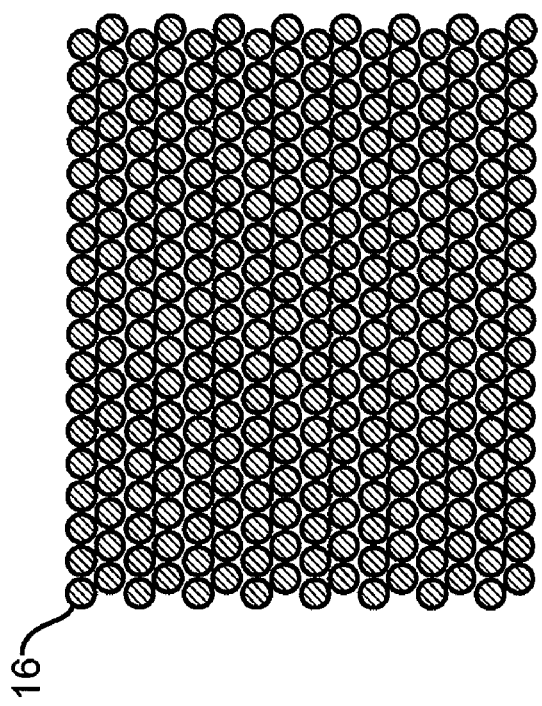
FIG. 2 shows a cross-section view through line 2-2 of FIG. 1.
Figure 1:
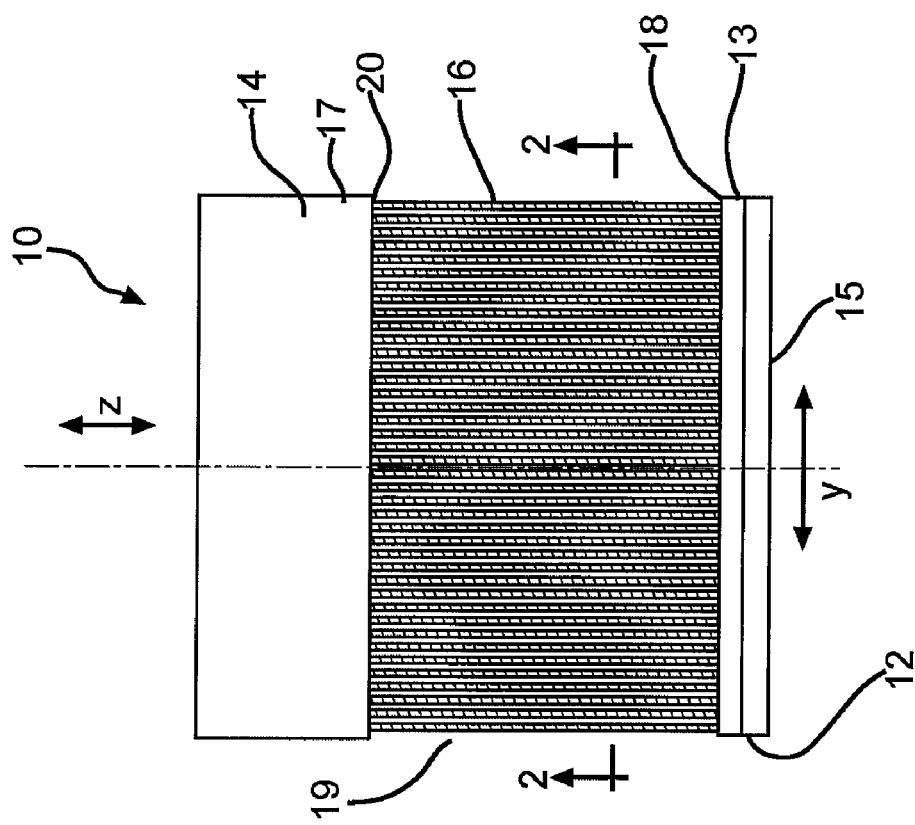
FIG. 1 shows a front view of one embodiment of an assembly having bodies with varied thermal expansion rates.

FIG. 1 shows a front view of one embodiment of an assembly 10 having a first body 12, and a second body 14 having a higher thermal expansion rate than the first body 12. In other embodiments, the first body 12 may have a higher thermal expansion rate than the second body 14. FIG. 2 shows a cross-section view through line 2-2 of FIG. 1. As shown in FIGS. 1 and 2, the assembly 10 may comprise a solar collector assembly having a first body 12 comprising an Alumina substrate 13 attached, through soldering or other means, to a Germanium solar cell 15, and a second body 14 comprising a Copper heat sink 17. In other embodiments, the solar collector assembly may comprise one or more differing components, and/or one or more of the components may be made of differing materials. In still other embodiments, the assembly 10 may be non-solar related, and the first and second bodies 12 and 14 may comprise differing components made of differing materials. A plurality of high conductivity members 16 may be attached to, and disposed between, both the first and second bodies 12 and 14 in a parallel alignment.

The high conductivity members 16 may be used to transfer heat from the first body 12 to the second body 14. The high conductivity members 16 may fill up most of the space 19 between the first and second bodies 12 and 14. In one embodiment, the high conductivity members 16 may fill up 90 percent of the space 19 between the first and second bodies 12 and 14. As a result, the thermal conductivity of the plurality of members 16 may approach the thermal conductivity which would result if only one solid member was used to fill up the entire space 19. In other embodiments, the high conductivity members 16 may fill up various amounts of the space 19 depending on their cross-section and spacing. The high conductivity members 16 may comprise circular, rectangular, hexagonal, square, or other shaped cross-sections spaced varying amounts apart. One end 18 of each high conductivity member 16 may be soldered to the first body 12, and a second end 20 of each high conductivity member 16 may be soldered to the second body 14. The high conductivity members 16 may comprise long, thin, Copper wires. The high conductivity members 16 may be more flexible than the first and second bodies 12 and 14 in order to allow and/or compensate for varied thermal expansion of the first and second bodies 12 and 14.

Figure 2A:
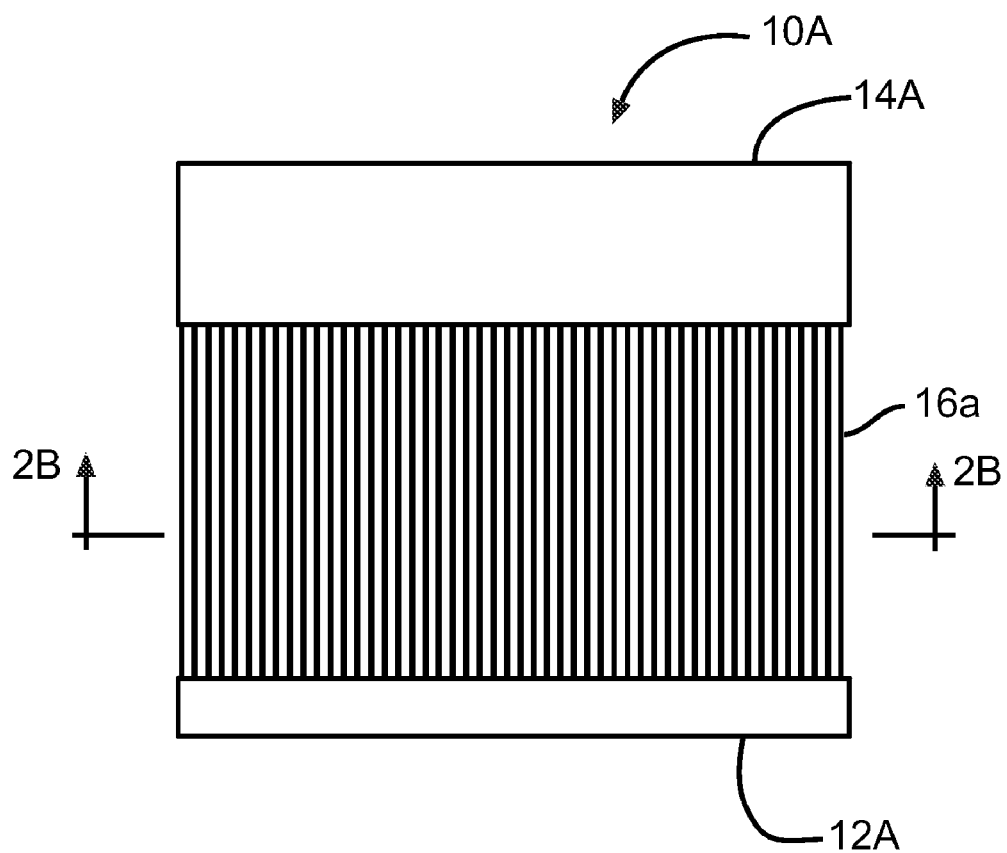
FIG. 2A shows a front view of one embodiment of an assembly having bodies connected by varying shaped high conductivity members.
Figure 2B:
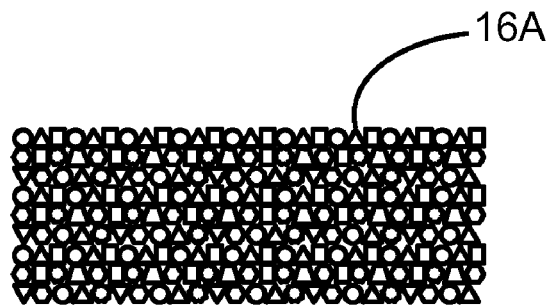
FIG. 2B shows a cross-section view through line 2B-2B of FIG. 2A.

In one embodiment, the high conductivity members 16 may be more flexible in lateral X and Y directions than the first and second bodies 12 and 14 in order to produce a low bending stiffness, but may be stiff in the Z direction. In another embodiment, the high conductivity members 16 may be highly thermally conductive in the Z direction, but may have low thermal conductivity in the lateral X and Y directions. In other embodiments, the high conductivity members 16 may be of differing shapes, sizes, and materials, may be in varied orientations and configurations, such as in a non-parallel alignment, may be of varied flexibility in one or more directions, may be of varied conductivities in one or more directions, may be attached to one or more additional bodies, and/or may be attached to the first and second bodies 12 and 14 using differing mechanisms. FIG. 2A and 2B show respectively a front view and a cross-section view, through line 2B-2B of FIG. 2A, of one embodiment of an assembly 10A having first and bodies 12A and 14A connected by varying shaped high conductivity members 16A.

Figure 3:
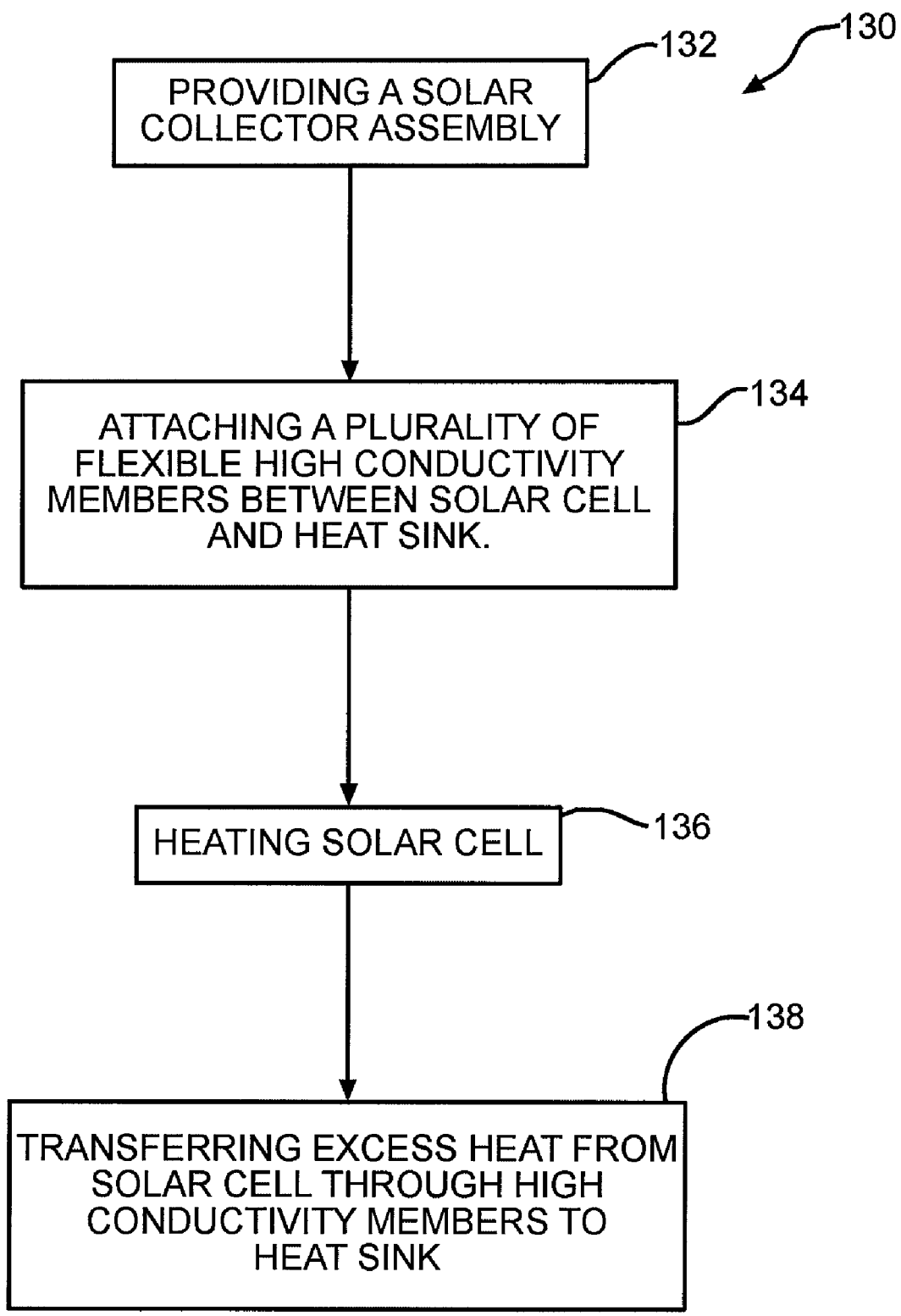
FIG. 3 shows a flowchart of one embodiment of a method of reducing stress and strain of a solar cell.

FIG. 3 shows a flowchart of one embodiment of a method 130 of reducing stress and strain of a solar cell 15. In one step 132, a solar collector assembly 10 may be provided comprising a solar cell 15 and a heat sink 17 having a different thermal expansion rate than the solar cell 15. In other embodiments, the assembly 10 may be a non solar-collector assembly and may include other types of first and second bodies 12 and 14. The assembly 10, including the first body 12 comprising the substrate 13 and solar cell 15, the second body 14 including the heat sink 17, and the high conductivity members 16, may comprise any of the embodiments disclosed within this application.

In another step 134, a plurality of high conductivity members 16 may be disposed and attached between the solar cell 15 and the heat sink 17 in a uniform, parallel alignment. One end 18 of each high conductivity member 16 may be attached, through soldering or other means, to a substrate 13 which is attached to the solar cell 15, and a second end 20 of each high conductivity member 16 may be attached, through soldering or other means, to the heat sink 17. In other embodiments, differing portions of the high conductivity members 16 may be attached to the solar cell 15 and heat sink 17. In still other embodiments, the high conductivity members 16 may be disposed and/or attached in varying configurations and orientations between varied shaped first and second bodies 12 and 14.

Figure 4:
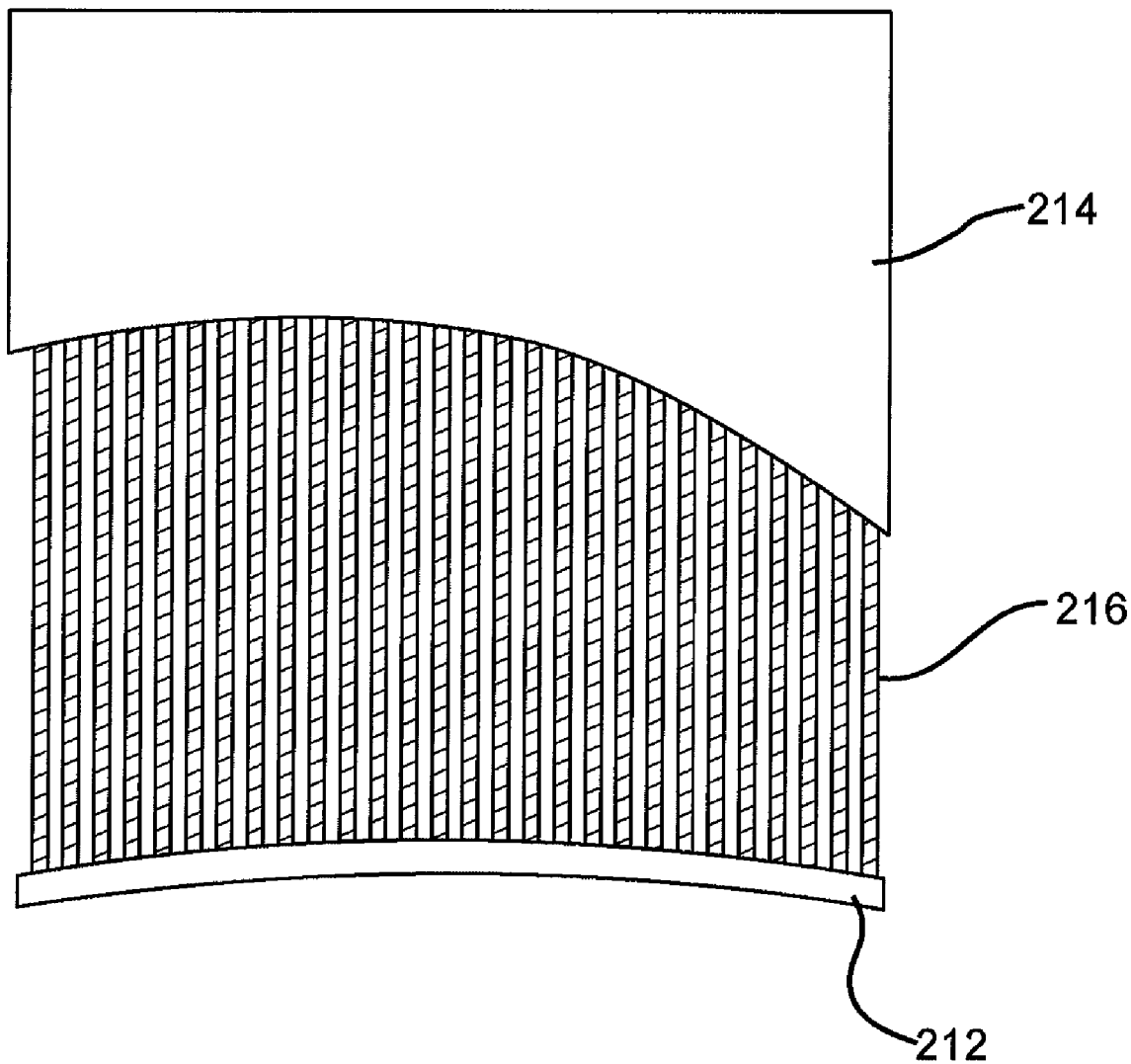
FIG. 4 shows a front view of another embodiment of an assembly having bodies with varied thermal expansion rates.
Figure 5:
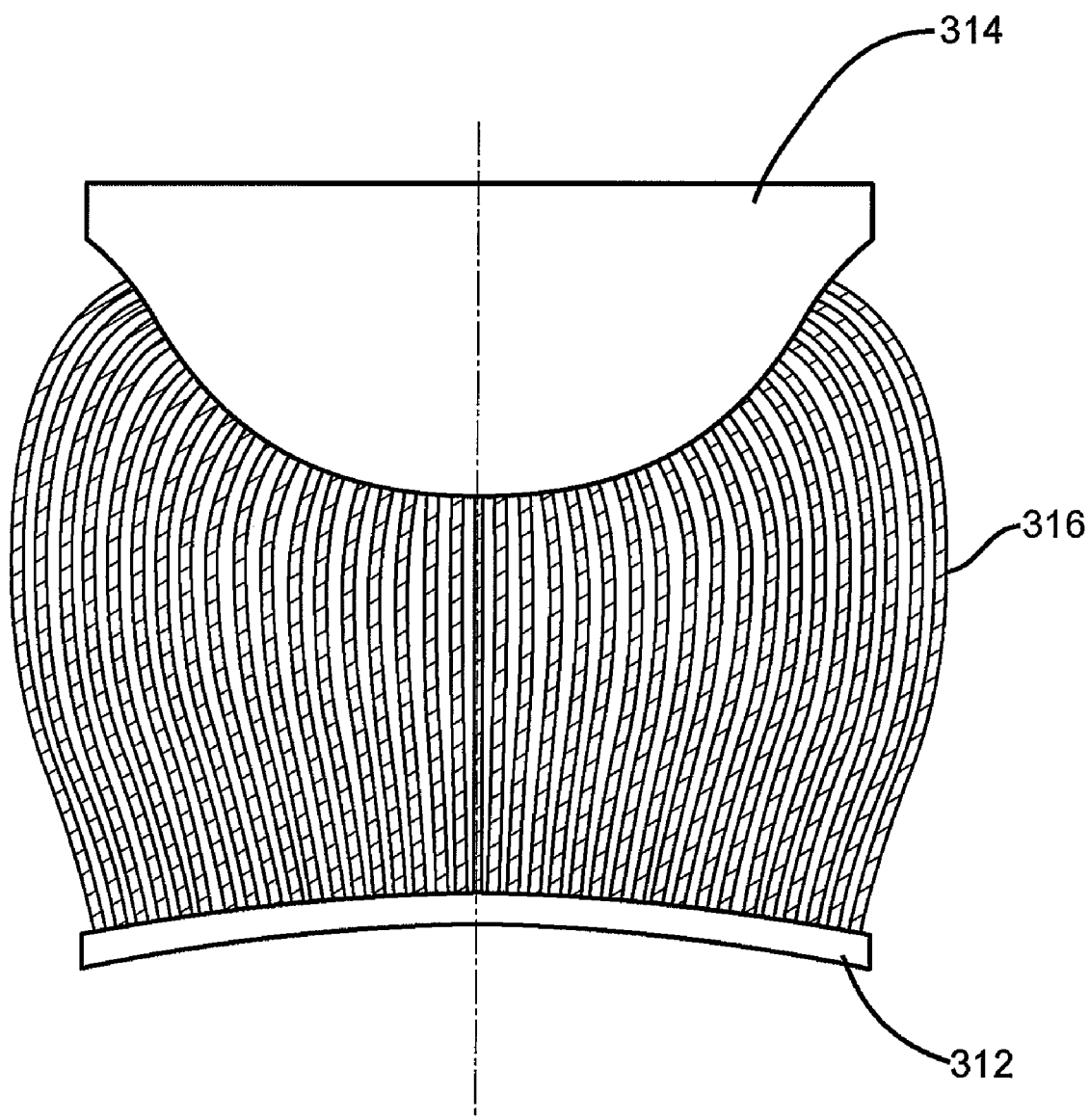
FIG. 5 shows a front view of still another embodiment of an assembly having bodies with varied thermal expansion rates.
Figure 6:
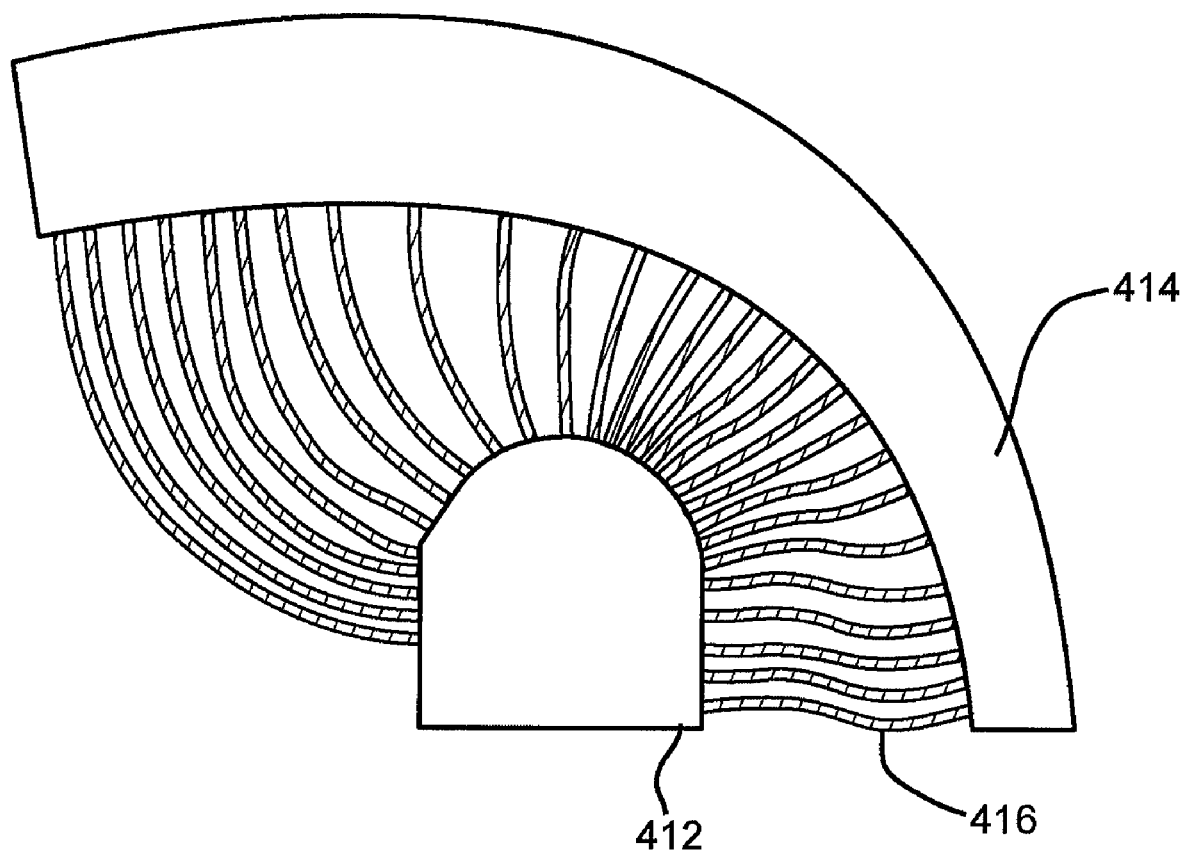
FIG. 6 shows a front view of yet another embodiment of an assembly having bodies with varied thermal expansion rates.

For instance, in one embodiment, as shown in FIG. 4, high conductivity members 216 may be disposed and attached between non-flat and non-parallel first and second bodies 212 and 214. In another embodiment, as shown in FIG. 5, non-straight and non-parallel high conductivity members 316 may be disposed and attached between non-flat and non-parallel first and second bodies 312 and 314. In still another embodiment, as shown in FIG. 6, non-uniformly spaced and non-equal high conductivity members 416 may be disposed and attached between non-flat and non-parallel first and second bodies 412 and 414.

Referring back to FIG. 3, in still another step 136, the solar cell 15 may be illuminated, and therefore heated, by the sun to generate electricity. In step 138, heat, an undesirable byproduct of the illumination, may be transferred from the solar cell 15 through the high conductivity members 16 to the heat sink 17 in order to cool the solar cell by dissipating its heat to the ambient atmosphere. During step 138, portions of the high conductivity members 16 close to the heat sink 17 may move at least one of more and less than portions of the high conductivity members 16 close to the solar cell 15 to compensate for the thermal expansion differences between the solar cell 15 and the heat sink 17.

Figure 7:
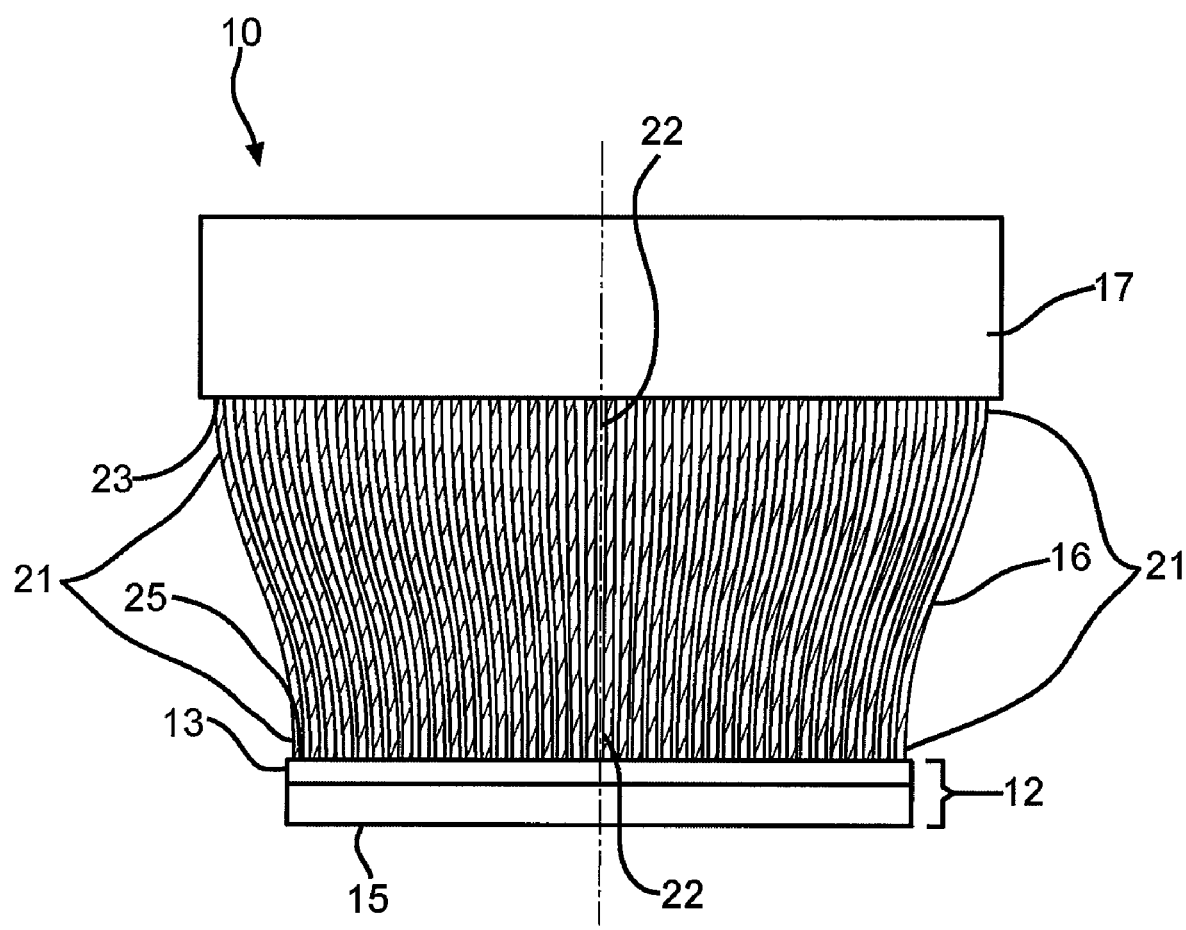
FIG. 7 shows a front view of the embodiment of FIG. 1 after the sun has heated up the assembly and the bodies have expanded due to the heat.

FIG. 7 shows a front view of the embodiment of FIG. 1 after the sun has heated up the assembly 10 and excess heat from the solar cell 15 has been transferred through the high conductivity members 16 to the heat sink 17. As shown, the heat has caused the Copper heat sink 17 to expand more than both the Germanium solar cell 15 and the Alumina substrate 13 due to the varied rates of thermal expansion. As a result of the flexible nature of the high conductivity members 16, portions 23 of the high conductivity members 16 which are close and/or attached to the heat sink 17 have moved more than portions 25 of the high conductivity members 16 which are close and/or attached to the solar cell 15 and substrate 13. In such manner, the attached high conductivity members 16 may compensate for the thermal expansion differences between the solar cell 15 and the heat sink 17. In other embodiments, portions 23 and 25 of the high conductivity members 16 may move at least one of more and less than each other depending on the varied thermal expansion rates of the solar cell 15 and the heat sink 17.

Figure 7A:
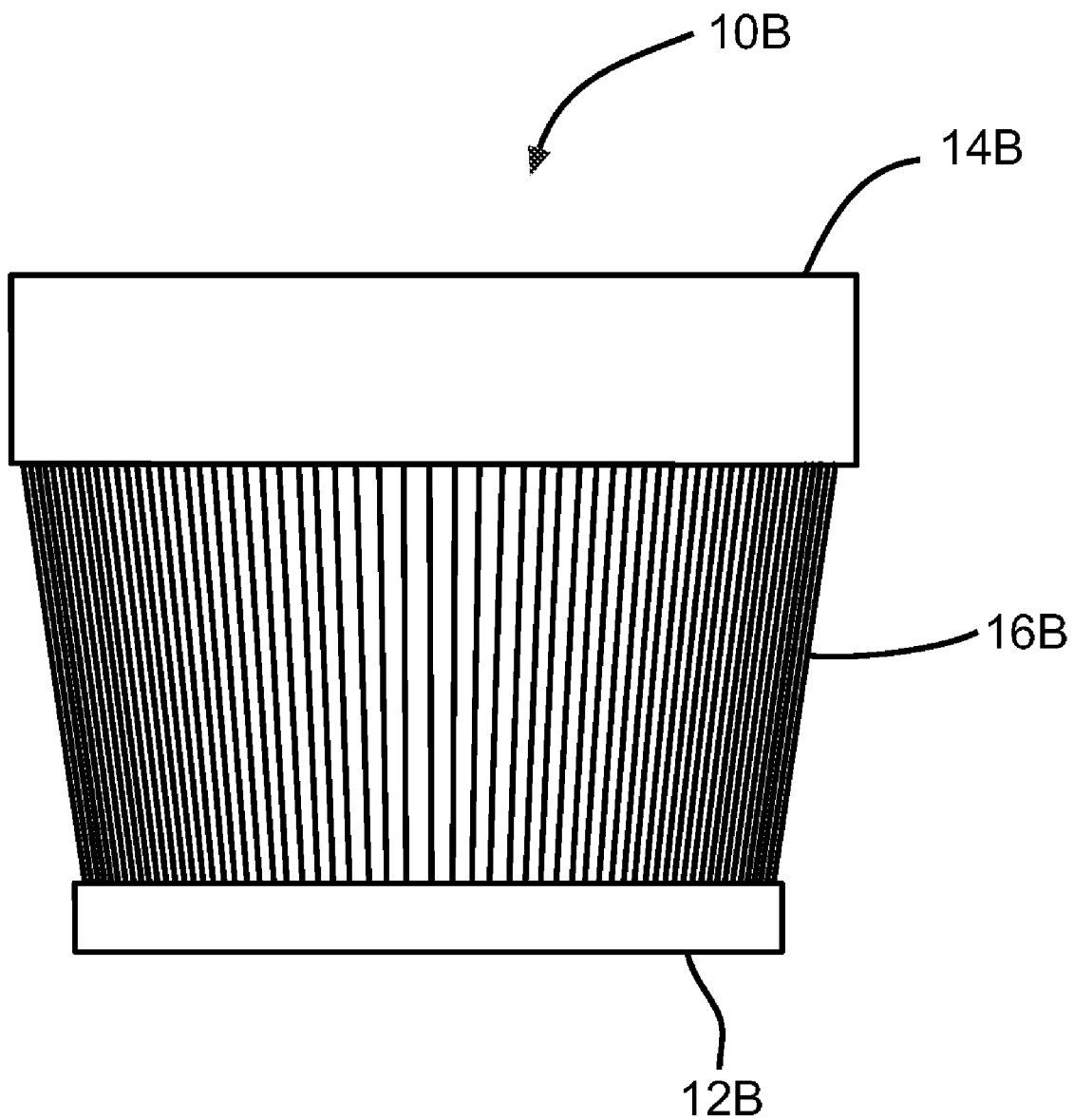
FIG. 7A shows a front view of one embodiment of an assembly having bodies connected by varying sized high conductive members.

FIG. 7 shows that wire 16 flexure is greater near the perimeter 21 of the interface between solar cell 15 and heat sink 17 and less near the center 22. Thus the need for wire 16 flexibility near the center may be less than near the perimeter. Wire rigidity may be proportional to the fourth power of the diameter. For a given area covered by wires, wire rigidity may be proportional to wire diameter squared. The wire 16 diameter may be varied from relatively large near the center to relatively small near the perimeter. Gradation may be continuous or varied in several larger steps. Gradation of wire 16 diameter can reduce the total number of wires needed to form a conductor with the needed degree of compliance or can, for the same number of wires 16, reduce the conductor length. Use of larger, circular cross-section wires 16 near the center may present the opportunity to fit smaller wires in the interstitial spaces between the larger wires. This may increase the conductivity of the wires as a whole. FIG. 7A shows a front view of one embodiment of an assembly 10B having first and second bodies 12B and 14B connected by varying sized high conductivity members 16B.

Figure 8:
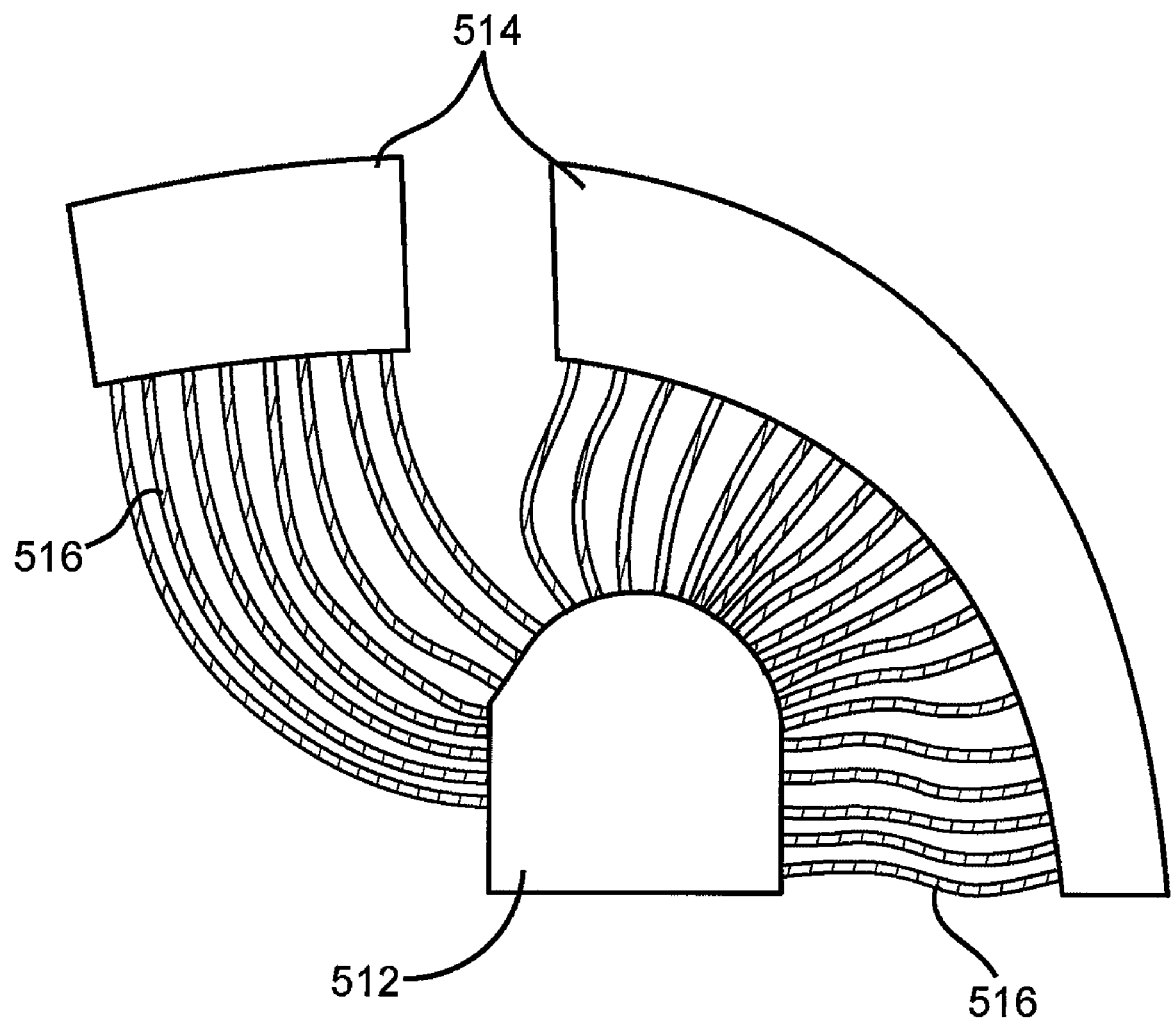
FIG. 8 shows a front view of still another embodiment of an assembly having bodies with varied thermal expansion rates.

In other embodiments, in additional steps, the high conductivity members 16 may be attached to one or more additional bodies, and the high conductivity members 16 may compensate for the varied thermal expansion rates of the additional bodies. For instance, in one embodiment, as shown in FIG. 8, high conductivity members 516 may be disposed and attached between one non-flat and non-parallel first body 512 and two non-flat and non-parallel second bodies 514. In still other embodiments, varied types, numbers, orientations, configurations, and sizes of high conductivity members 16 may be attached to varied portions, types, sizes, and numbers of bodies in varied orientations and configurations.

A typical assembly using 30 gage wire may have wires approximately 0.01 inches in diameter and about 0.16 inches long. A substrate one inch long may have 100 wires across its width. If 40 gage wire is used, the wire diameter may be about 0.00314 inches and the wires may be approximately 0.08 inches long, which means that an assembly one inch wide may have approximately 320 wires across its width. Although the figures illustrating this do not show that many wires, they illustrate that the wires transfer heat efficiently while decoupling the two bodies structurally, by virtue of the fact that a long skinny wire has relatively small bending stiffness. For the materials in this embodiment, a length to diameter ratio of at least 20 may be sufficient to allow the thermally conductive elements to conduct the heat efficiently and decouple the two bodies structurally.

The amount of stress and strain on the first body 12 is a function of the size of the first body 12 and the size of the high conductivity members 16. In additional embodiments, the size of the high conductivity members 16, including their lengths and diameters, may be adjusted based on the size of the first body 12 and the particular application of use in order to lower the stress and strain on the first body 12 to the desired amount.

The disclosure may reduce stress and strain on the first body 12 while still providing for a high transfer of heat between the varied thermal expansion rate first and second bodies 12 and 14. In such manner, a lower temperature difference may be maintained between the first and second bodies 12 and 14. This may allow for a decreased sized second body 14 due to the higher temperature difference between the second body 14 and the ambient atmosphere, which may decrease cost and allow for a varied configuration second body 14. It may also produce a lower temperature on the first body 12, which may increase efficiency and may also increase mean time before failure of the first body 12. The increase in efficiency may increase the power available from each first body 12, while the increased reliability may decrease maintenance and replacement costs. The disclosure may further reduce one or more other types of problems associated with one or more of the existing assemblies.

It should be understood, of course, that the foregoing relates to exemplary embodiments of the disclosure and that modifications may be made without departing from the spirit and scope of the disclosure as set forth in the following claims.

The invention claimed is:

1. A heat conducting assembly comprising:
   a first body and a second body;
   a plurality of high conductivity members attached to both the first and second bodies, wherein the high conductivity members are more flexible than the first and second bodies in order to allow for varied thermal expansion of the first and second bodies;
   and at least one of the following:
   (1) the plurality of high conductivity members are more flexible in lateral X and Y directions than the first and second bodies in order to produce a low bending stiffness, wherein the lateral X and Y directions extend laterally along the first and second bodies, and the plurality of high conductivity members are more stiff in the Z direction than the first and second bodies, wherein the Z direction extends between the first and second bodies perpendicular to the lateral X and Y directions; and
   (2) the plurality of high conductivity members vary symmetrically from being largest near a center of the first and second bodies to being smallest at perimeters of the first and second bodies.

2. The assembly of claim 1 wherein the first and second bodies have different thermal rates of expansion.

3. The assembly of claim 1 wherein the assembly is a solar collector assembly.

4. The assembly of claim 1 wherein the first body comprises a substrate attached to a solar cell.

5. The assembly of claim 4 wherein the substrate is made of Alumina and the solar cell is made of Germanium.

6. The assembly of claim 1 wherein the second body comprises a heat sink.

7. The assembly of claim 6 wherein the heat sink is made of Copper.

8. The assembly of claim 1 wherein one end of each high conductivity member is soldered to the first body and a second end of each high conductivity member is soldered to the second body.

9. The assembly of claim 1 wherein the high conductivity members comprise wires.

10. The assembly of claim 1 wherein the high conductivity members are long and thin.

11. The assembly of claim 1 wherein the high conductivity members are made of Copper.

12. The assembly of claim 1 wherein the high conductivity members are more flexible in the lateral X and Y directions than the first and second bodies.

13. The assembly of claim 1 wherein the high conductivity members have at least one of rectangular, hexagonal, and square cross-sections.

14. The assembly of claim 1 wherein the high conductivity members are attached to at least one additional body.

15. The heat conducting assembly of claim 1 wherein the plurality of high conductivity members comprise varying diameters with the diameters of the high conductivity members varying from being largest near the center of the first and second bodies to being smallest at the perimeters of the first and second bodies.

16. The heat conducting assembly of claim 1 wherein the plurality of high conductivity members are more flexible in the lateral X and Y directions than the first and second bodies in order to produce the low bending stiffness, and the plurality of high conductivity members are more stiff in the Z direction than the first and second bodies.

17. The high conducting assembly of claim 1 wherein the plurality of high conductivity members are more thermally conductive in the Z direction than in the lateral X and Y directions.

18. The high conducting assembly of claim 1 wherein the plurality of high conductivity members are non-uniformly spaced.

19. The heat conducting assembly of claim 1 wherein the plurality of high conductivity members have varying sized cross-sections.

20. The heat conducting assembly of claim 1 wherein the plurality of high conductivity members have varying lengths.

21. The heat conducting assembly of claim 1 wherein the plurality of high conductivity members have varying shapes.

22. The heat conducting assembly of claim 1 wherein the plurality of high conductivity members symmetrically vary from being largest near the center of the first and second bodies to being smallest at the perimeters of the first and second bodies.

23. The heat conducting assembly of claim 22 wherein the plurality of high conductivity members continuously and symmetrically vary from being largest near the center of the first and second bodies to being smallest at the perimeters of the first and second bodies.

24. A solar collector assembly comprising:
a solar cell;
a heat sink which has a different thermal expansion rate than the solar cell; and a plurality of high conductivity members attached between the solar cell and the heat sink for transferring heat from the solar cell to the heat sink while compensating for thermal expansion differences between the solar cell and the heat sink;
and at least one of the following:
(1) the plurality of high conductivity members are more flexible in lateral X and Y directions than the solar cell and the heat sink in order to produce a low bending stiffness, wherein the lateral X and Y directions extend laterally along the solar cell and the heat sink, and the plurality of high conductivity members are more stiff in the Z direction than the solar cell and the heat sink, wherein the Z direction extends between the solar cell and the heat sink perpendicular to the lateral X and Y directions; and
(2) the plurality of high conductivity members vary symmetrically from being largest near a center of the solar cell and the heat sink to being smallest at perimeters of the solar cell and the heat sink.

25. The solar collector assembly of claim 24 wherein the solar cell is made of Germanium and the heat sink is made of Copper.

26. The solar collector assembly of claim 24 wherein one end of each high conductivity member is attached to a substrate which is attached to the solar cell and a second end of each high conductivity member is attached to the heat sink.

27. The solar collector assembly of claim 26 wherein the high conductivity members are soldered to the substrate and the heat sink.

28. The solar collector assembly of claim 24 wherein the high conductivity members are more flexible than the solar cell and the heat sink in order to allow for varied thermal expansion of the solar cell and the heat sink.

29. The solar collector assembly of claim 28 wherein the high conductivity members are more flexible in the lateral X and Y directions than the solar cell and the heat sink.

30. The solar collector assembly of claim 24 wherein the high conductivity members comprise wires.

31. The solar collector assembly of claim 30 wherein the wires are long and thin.

32. The solar collector assembly of claim 24 wherein the high conductivity members are made of Copper.

33. The solar collector assembly of claim 24 wherein the high conductivity members have at least one of rectangular, hexagonal, and square cross-sections.

34. The solar collector assembly of claim 24 wherein the high conductivity members are attached to at least one additional body.

35. The solar collector assembly of claim 24 wherein the plurality of high conductivity members comprise varying diameters with the diameters of the high conductivity members varying from being largest near the center of the solar cell and the heat sink to being smallest at the perimeters of the solar cell and the heat sink.

36. The solar collector assembly of claim 24 wherein the plurality of high conductivity members are more flexible in the lateral X and Y directions than the solar cell and the heat sink in order to produce the low bending stiffness, and the plurality of high conductivity members are more stiff in the Z direction than the solar cell and the heat sink.

37. The solar collector assembly of claim 24 wherein the plurality of high conductivity members are more thermally conductive in the Z direction than in the lateral X and Y directions.

38. The solar collector assembly of claim 24 wherein the plurality of high conductivity members are non-uniformly spaced.

39. The solar collector assembly of claim 24 wherein the plurality of high conductivity members have varying sized cross-sections.

40. The solar collector assembly of claim 24 wherein the plurality of high conductivity members have varying lengths.

41. The solar collector assembly of claim 24 wherein the plurality of high conductivity members have varying shapes.

42. The solar collector assembly of claim 24 wherein the plurality of high conductivity members symmetrically vary from being largest near the center of the solar cell and the heat sink to being smallest at the perimeters of the solar cell and the heat sink.

43. The solar collector assembly of claim 42 wherein the plurality of high conductivity members continuously and symmetrically vary from being largest near the center of the solar cell and the heat sink to being smallest at the perimeters of the solar cell and the heat sink.

44. A method of reducing at least one of stress and strain of a solar cell comprising:
providing a solar collector assembly comprising a solar cell and a heat sink, wherein the heat sink has a different thermal expansion rate than the solar cell;
attaching a plurality of high conductivity members between the solar cell and the heat sink with at least one of the following: (1) the plurality of high conductivity members being more flexible in lateral X and Y directions than the solar cell and the heat sink in order to produce a low bending stiffness, wherein the lateral X and Y directions extend laterally along the solar cell and the heat sink, and the plurality of high conductivity members being more stiff in the Z direction than the solar cell and the heat sink, wherein the Z direction extends between the solar cell and the heat sink perpendicular to the lateral X and Y directions; and (2) the plurality of high conductivity members varying symmetrically from being largest near a center of the solar cell and the heat sink to being smallest at perimeters of the solar cell and the heat sink;

heating the solar cell; and transferring heat from the solar cell through the high conductivity members to the heat sink, wherein during the transfer of heat portions of the high conductivity members close to the heat sink move at least one of more and less than portions of the high conductivity members close to the solar cell to compensate for the thermal expansion differences between the solar cell and the heat sink.

45. The method of claim 44 wherein the solar cell is made of Germanium and the heat sink is made of Copper.

46. The method of claim 44 wherein during the attaching step one end of each high conductivity member is attached to a substrate which is attached to the solar cell and a second end of each high conductivity member is attached to the heat sink.

47. The method of claim 46 wherein during the attaching step the high conductivity members are soldered to the substrate and the heat sink.

48. The method of claim 44 wherein the high conductivity members are more flexible than the solar cell and the heat sink.

49. The method of claim 48 wherein the high conductivity members are more flexible in the lateral X and Y directions than the solar cell and the heat sink.

50. The method of claim 44 wherein the high conductivity members comprise long and thin wires.

51. The method of claim 44 wherein the high conductivity members are made of Copper.

52. The method of claim 44 wherein the high conductivity members have at least one of rectangular, hexagonal, and square cross-sections.

53. The method of claim 44 further comprising the step of attaching the high conductivity members to at least one additional body.

54. The method of claim 44 wherein the plurality of high conductivity members comprise varying diameters, and the attaching comprises attaching the high conductivity members having the largest diameters near the center of the solar cell and the heat sink and attaching the high conductivity members having the smallest diameters at the perimeters of the solar cell and the heat sink.

55. The method of claim 44 wherein the plurality of attached high conductivity members are more flexible in the lateral X and Y directions than the solar cell and the heat sink in order to produce the low bending stiffness, and the plurality of attached high conductivity members are more stiff in the Z direction than the solar cell and the heat sink.

56. The method of claim 44 wherein the plurality of attached high conductivity members are more thermally conductive in the Z direction than in the lateral X and Y directions.

57. The method of claim 44 wherein the plurality of attached high conductivity members are non-uniformly spaced.

58. The method of claim 44 wherein the plurality of high conductivity members have varying sized cross-sections.

59. The method of claim 44 wherein the plurality of high conductivity members have varying lengths.

60. The method of claim 44 wherein the plurality of high conductivity members have varying shapes.

61. The method of claim 44 wherein the attaching comprises symmetrically attaching the high conductivity members which are largest near the center of the solar cell and the heat sink and attaching the high conductivity members which are smallest at the perimeters of the solar cell and the heat sink.

62. The method of claim 44 wherein the attaching comprises continuously and symmetrically attaching the high conductivity members which are largest near the center of the solar cell and the heat sink and attaching the high conductivity members which are smallest at the perimeters of the solar cell and the heat sink.

* * * * *